(12) United States Patent
Kim et al.

(10) Patent No.: US 9,843,020 B2
(45) Date of Patent: Dec. 12, 2017

(54) DISPLAY APPARATUS HAVING ORGANIC AND INORGANIC INSULATING LAYERS FOR PROTECTING FROM MOISTURE PERMEATION

(71) Applicant: SAMSUNG DISPLAY CO., LTD., Yongin-si, Gyeonggi-do (KR)

(72) Inventors: Taewoong Kim, Yongin-si (KR); Younggug Seol, Yongin-si (KR); Boik Park, Yongin-si (KR); Taean Seo, Yongin-si (KR); Minsu Lee, Yongin-si (KR); Sunhee Lee, Yongin-si (KR); Pilsuk Lee, Yongin-si (KR); Jinhwan Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/150,246

(22) Filed: May 9, 2016

(65) Prior Publication Data

US 2017/0025637 A1 Jan. 26, 2017

(30) Foreign Application Priority Data

Jul. 23, 2015 (KR) .................. 10-2015-0104353

(51) Int. Cl.
| | |
|---|---|
| *H01L 27/32* | (2006.01) |
| *H01L 51/52* | (2006.01) |
| *H01L 51/56* | (2006.01) |
| *H01L 27/12* | (2006.01) |

(52) U.S. Cl.
CPC ...... *H01L 51/5253* (2013.01); *H01L 27/3258* (2013.01); *H01L 27/3262* (2013.01); *H01L 27/3276* (2013.01); *H01L 51/56* (2013.01); *H01L 27/124* (2013.01); *H01L 27/1248* (2013.01); *H01L 27/1259* (2013.01); *H01L 2227/323* (2013.01)

(58) Field of Classification Search
CPC ............. H01L 27/3262; H01L 27/3258; H01L 27/3276; H01L 51/5253
See application file for complete search history.

(56) References Cited

U.S. PATENT DOCUMENTS

| | | |
|---|---|---|
| 2014/0061607 A1 | 3/2014 | You et al. |
| 2014/0138651 A1 | 5/2014 | Oh |
| 2014/0217373 A1 | 8/2014 | Youn et al. |
| 2015/0028303 A1 | 1/2015 | Kim et al. |

(Continued)

FOREIGN PATENT DOCUMENTS

| | | |
|---|---|---|
| KR | 10-2008-0092120 A | 10/2008 |
| KR | 10-2014-0032267 A | 3/2014 |

(Continued)

*Primary Examiner* — Hoai V Pham
(74) *Attorney, Agent, or Firm* — Lewis Roca Rothgerber Christie LLP (57) ABSTRACT

A display apparatus capable of preventing (or protecting from) permeation of moisture. The apparatus includes a substrate comprising a display area and a peripheral area surrounding the display area; a pad unit located on the peripheral area; an organic insulating layer covering the display area and a part of the peripheral area adjacent to the display area; and an inorganic insulating layer that covers at least a first area when the first area is a part between the organic insulating layer and the pad unit.

18 Claims, 6 Drawing Sheets

(56) References Cited

U.S. PATENT DOCUMENTS

2015/0041769 A1 2/2015 Kim et al.
2016/0293883 A1* 10/2016 Hong .................. H01L 27/3258

FOREIGN PATENT DOCUMENTS

| KR | 10-2014-0064154 A | 5/2014 |
| KR | 10-2014-0099164 A | 8/2014 |
| KR | 10-2015-0012203 A | 2/2015 |
| KR | 10-2015-0019129 A | 2/2015 |

* cited by examiner

DISPLAY APPARATUS HAVING ORGANIC AND INORGANIC INSULATING LAYERS FOR PROTECTING FROM MOISTURE PERMEATION

CROSS-REFERENCE TO RELATED APPLICATION

This application claims priority to and the benefit of Korean Patent Application No. 10-2015-0104353, filed on Jul. 23, 2015, in the Korean Intellectual Property Office, the disclosure of which is incorporated herein in its entirety by reference.

BACKGROUND

1. Field

One or more exemplary embodiments relate to a display apparatus, and more particularly, to a display apparatus capable of preventing or protecting from permeation of moisture.

2. Description of the Related Art

In general, a display apparatus may provide various types (kinds) of information including static images, moving images, status and/or operating information of electronic devices, one or more user interfaces for easy manipulations of electronic devices, and/or the like. There has been a recent attempt to further increase portability and convenience of use of the display apparatus by providing flexibility to the display apparatus.

However, there is a problem in a related art display apparatus that when the display apparatus is bent according to the flexibility thereof, the display apparatus may not be properly bent and/or may be damaged (such as detachments and/or cracks between diverse elements of the display apparatus).

SUMMARY

Aspects of one or more exemplary embodiments are directed toward a display apparatus capable of preventing or protecting from permeation of moisture.

Additional aspects will be set forth in part in the description which follows and, in part, will be apparent from the description, or may be learned by practice of the presented embodiments.

According to one or more exemplary embodiments, a display apparatus includes a substrate including a display area and a peripheral area surrounding the display area; a pad unit located on the peripheral area; an organic insulating layer covering the display area and a part of the peripheral area adjacent to the display area; and an inorganic insulating layer that covers at least a first area when the first area is a part between the organic insulating layer and the pad unit.

The organic insulating layer and the inorganic insulating layer may be located on a same layer.

The organic insulating layer and the inorganic insulating layer may contact each other.

A first end portion surface of the organic insulating layer in a direction of the inorganic insulating layer may surface-contact a second end portion surface of the inorganic insulating layer in a direction of the organic insulating layer.

The display apparatus may further include: a thin film encapsulation layer located on the organic insulating layer and extending onto the outside of the organic insulating layer.

End portion surfaces other than the first end portion surface of the organic insulating layer may be covered by the thin film encapsulation layer.

End portion surfaces of the organic insulating layer may contact the second end portion surface or the thin film encapsulation layer.

The thin film encapsulation layer may cover at least a part of the inorganic insulating layer.

The inorganic insulating layer may extend to cover a second area when the second area is a part of the substrate in which the pad unit is located.

The pad unit may be located on the inorganic insulating layer.

The display apparatus may further include: a connection wiring disposed on the peripheral area such that the connection wiring is located below the inorganic insulating layer and below the organic insulting layer, wherein the pad unit is electrically connected to the connection wiring via a through hole formed in the inorganic insulating layer.

The substrate may have a bending axis extending in one direction, wherein the bending axis does not extend across the inorganic insulating layer.

The bending axis may include a first bending axis and a second bending axis in parallel to the first bending axis, wherein the inorganic insulating layer is located between the first bending axis and the second bending axis.

The pad unit may be disposed on the inorganic insulating layer.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Reference will now be made in more detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

Since the inventive concept may have diverse modified embodiments, exemplary embodiments are illustrated in the drawings and are described in the detailed description of the inventive concept. The advantages, features and aspects of the inventive concept will become apparent from the following description of the embodiments with reference to the accompanying drawings, which is set forth hereinafter. The inventive concept may, however, be embodied in different forms and should not be construed as limited to the embodiments set forth herein.

Hereinafter, embodiments of the inventive concept will be described in more detail with reference to the accompanying drawings. In addition, in the present specification and drawings, like reference numerals refer to like elements throughout, and thus, a redundant description is omitted.

It will be understood that although the terms "first", "second", etc. may be used herein to describe various components, these components should not be limited by these terms. These components are only used to distinguish one component from another. The terms of a singular form may include plural forms unless referred to the contrary.

The meaning of 'comprise', 'include', or 'have' specifies a property, a region, a fixed number, an act, a process, an element and/or a component but does not exclude other properties, regions, fixed numbers, acts, processes, elements and/or components. It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order. As used herein, the term "and/or" includes any and all combinations of one or more of the associated listed items.

Figure 1:
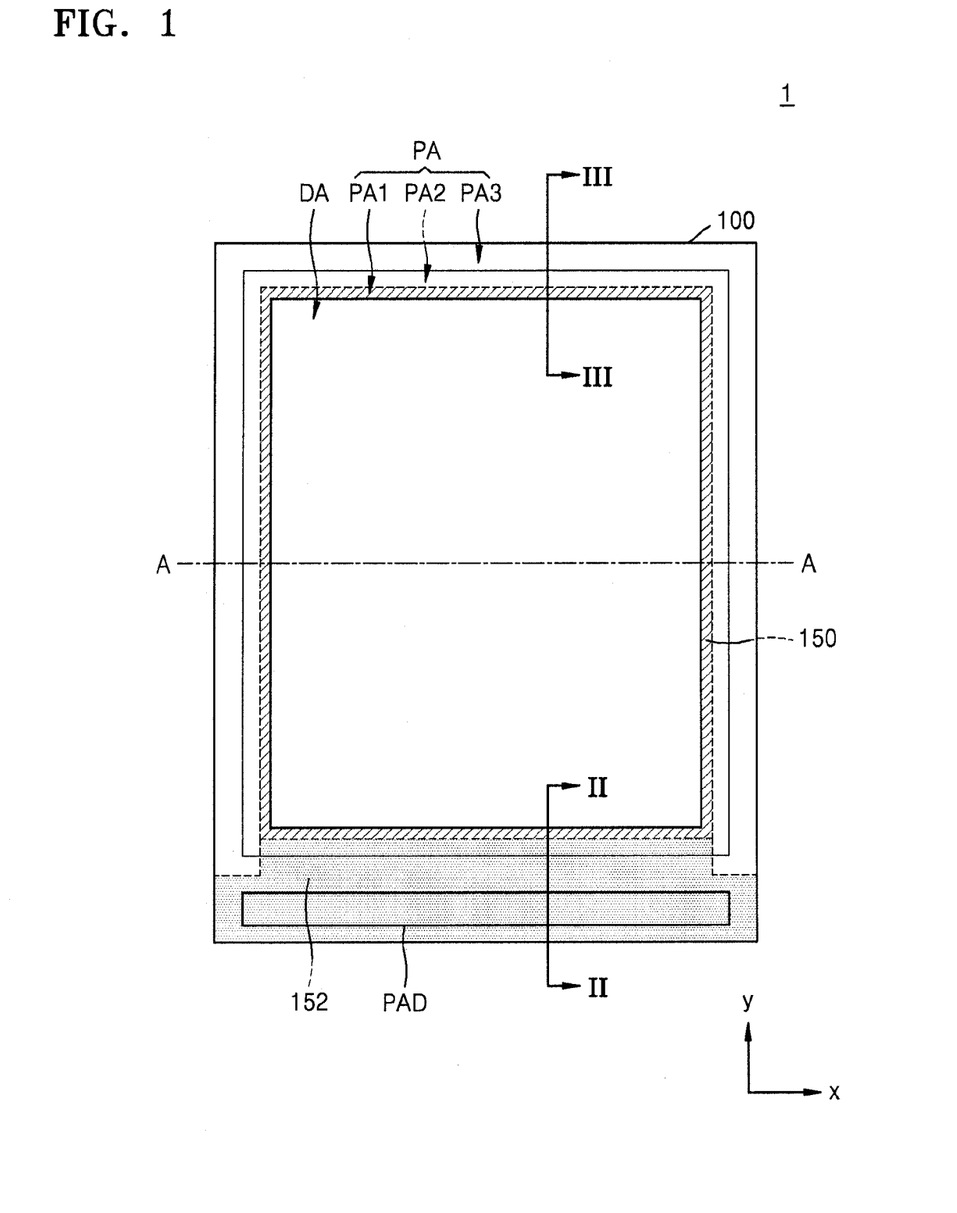
FIG. 1 is a schematic cross-sectional view of a display apparatus according to an exemplary embodiment.

FIG. 1 is a schematic cross-sectional view of a display apparatus 1 according to an exemplary embodiment.

Referring to FIG. 1, the display apparatus 1 according to an exemplary embodiment may include a substrate 100, a pad unit PAD, an organic insulating layer 150 and an inorganic insulating layer 152 that are provided on the substrate 100.

The substrate 100 having flexibility or bendability may include various materials, for example, a metal material or a plastic material such as polyethylene terephthalate (PET), polyethylene naphthalate (PEN), polyimide (PI), etc. However, the materials of the substrate 100 of the display apparatus 1 according to the inventive concept are not necessarily limited thereto and may be variously modified.

The substrate 100 may include a display area DA and a peripheral area PA surrounding the display area DA. The peripheral area PA may include a first peripheral area PA1, a second peripheral area PA2, and a third peripheral area PA3 surrounding and adjacent to (or near to) the display area DA in this stated order.

A display unit may be disposed in the display area DA of the substrate 100 and may include a plurality of display devices. The plurality of display devices may be, for example, liquid crystal devices or organic light-emitting devices. The display unit may include thin layer transistors that are electrically connected to the plurality of display devices. In the present embodiment, the organic light-emitting device may be provided as the display device.

The pad unit PAD may be located in the peripheral area PA of the substrate 100. The pad unit PAD may be located in the peripheral area PA corresponding to one end portion of the display area DA and, may include a plurality of pads. That is, the plurality of pads may be disposed in the peripheral area PA corresponding to one end portion of the display area DA in one direction to form the pad unit PAD. The pad unit PAD may be exposed to the outside through an opening formed in the inorganic insulating layer 152 that will be described later in more detail. A flexible printed circuit board (FPCB) may be attached onto the pad unit PAD.

The pad unit PAD may be formed in a way that the plurality of pads are exposed to the outside through an opening 400 (see FIG. 2) and the FPCB is physically attached onto the plurality of pads as described above. Thus, there is a problem that an end portion of the display area DA in a direction of the pad unit PAD may be more vulnerable to permeation of moisture than other end portions of the display area DA. In this regard, the display apparatus 1 of the present embodiment provides a solution to this problem.

The organic insulating layer 150 may be disposed on the display area DA of the substrate 100. The organic insulating layer 150 may be included in the display unit and may have a single or multiple layer structure. The organic insulating layer 150 may cover the display DA and a part of the peripheral area PA adjacent to the display area DA. In other words, as shown in FIG. 1, the organic insulating layer 150 may cover the display area DA and the first peripheral area PA1 adjacent to the display area DA of the peripheral area PA. The organic insulating layer 150 may include an organic insulating material and may include, for example, an acryl-based organic substance, benzocyclobutene (BCB), etc.

The inorganic insulating layer 152 may be disposed on the peripheral area PA of the substrate 100. The inorganic insulating layer 152 may be disposed on the same layer as the organic insulating layer 150. The inorganic insulating layer 152 may cover at least a first area when the first area is defined as an area between the organic insulating layer 150 and the pad unit PAD. When a part of the substrate 100, in which the pad unit PAD is located, is defined as a second area, the inorganic insulating layer 152 may extend on the second area to cover the second area. That is, the inorganic insulating layer 152 may be disposed in the whole surface of an area, in which the pad unit PAD is located, from one end portion of the organic insulating layer 150 in a direction in which the pad unit PAD is located. Thus, the pad unit PAD may be located on the inorganic insulating layer 152.

The display apparatus 1 according to the present embodiment may have a bending axis A-A formed in one direction (x axis direction). In this regard, the bending axis A-A may not be formed across the inorganic insulating layer 152 since the inorganic insulating layer 152 is vulnerable to cracks, which decreases the bendability of the display apparatus 1. That is, when the display apparatus 1 according to the present embodiment is bent along the bending axis A-A, the bending axis A-A is not formed across the inorganic insulating layer 152 that is vulnerable to cracks, thereby securing the bendability of the display apparatus 1 and also dramatically reducing damage to the inorganic insulating layer 152 by the cracks.

Meanwhile, a thin film encapsulation layer 300 may be disposed on the display area DA. The thin film encapsulation layer 300 may be disposed on the organic insulating layer 150 and, may be disposed above the organic insulating layer 150 to cover the organic light-emitting device 200. Since the organic light-emitting device 200 is vulnerable to permeation of moisture, the organic light-emitting device 200 may prevent (or protect) oxygen and moisture from entering into the display unit from the outside through the thin film encapsulation layer 300. The thin film encapsulation layer 300 may have a multilayer structure in which organic layers and inorganic layers are alternately stacked.

The thin film encapsulation layer 300 for sealing may completely cover the display unit so as to seal the display unit, and, as shown in FIG. 1, may cover the display area DA and the first peripheral area PA1 and the second peripheral area PA2 adjacent to the display area DA. In this regard, the thin film encapsulation layer 300 may cover at least a part of the inorganic insulating layer 152 located in an area between the organic insulating layer 150 and the pad unit PAD.

As described above, the thin film encapsulation layer 300 may cover the first peripheral area PA1 and the second peripheral area PA2 adjacent to the display area DA, and thus end portion surfaces other than one end portion surface formed by an extension portion of extending the inorganic insulating layer 152 may be covered by the thin film encapsulation layer 300. In other words, an end portion surface of the organic insulating layer 150 may contact the end portion surface of the inorganic insulating layer 152 or may contact the thin film encapsulation layer 300.

Figure 2:
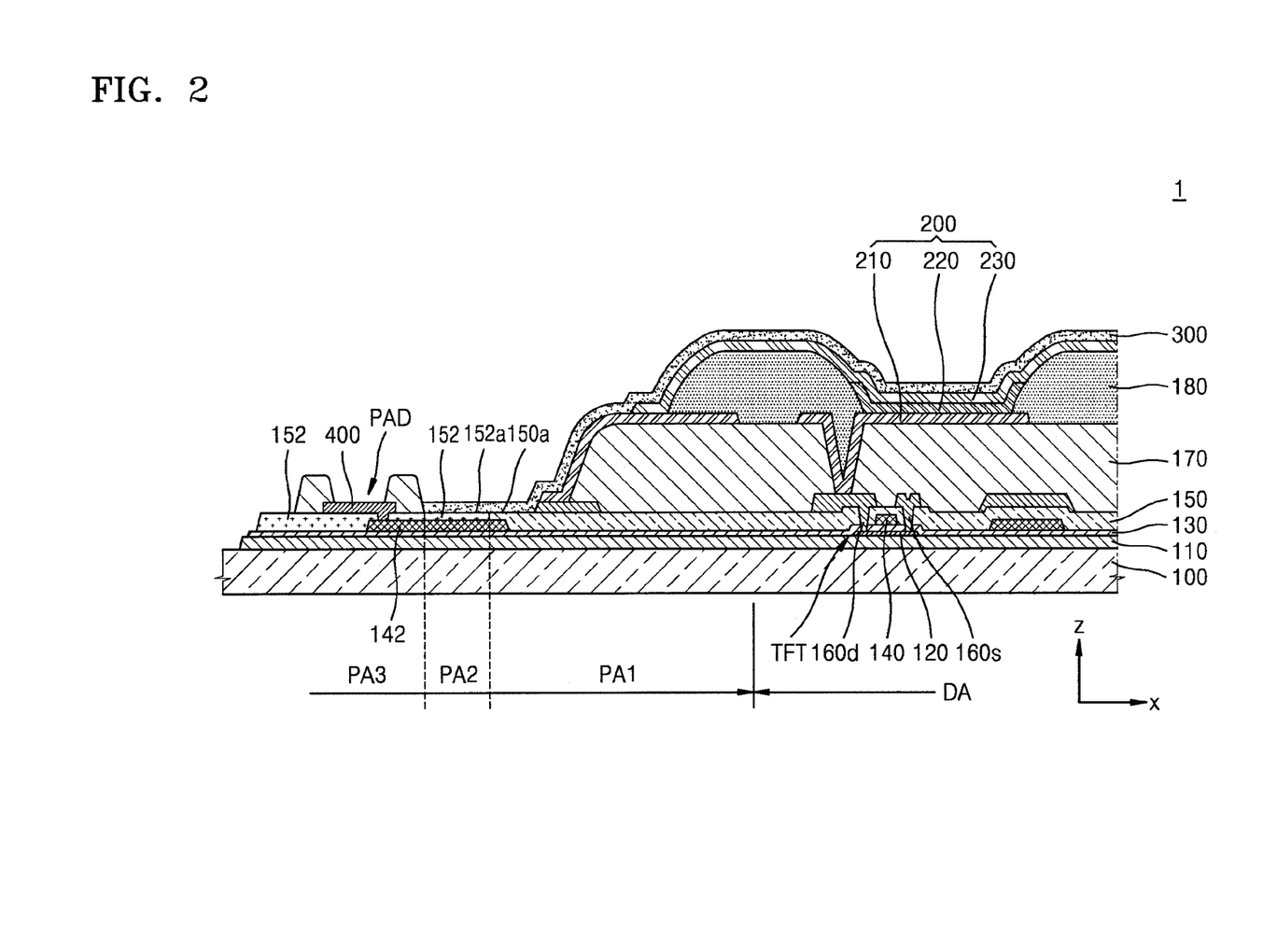
FIG. 2 is a schematic cross-sectional view of the display apparatus of FIG. 1 taken along a line II-II.

FIG. 2 is a schematic cross-sectional view of the display apparatus 1 of FIG. 1 taken along a line II-II.

Referring to FIG. 2, the substrate 100 may include the display area DA and the peripheral area PA surrounding the display area DA. The peripheral area PA may include the first peripheral area PA1, the second peripheral area PA2, and a third peripheral area PA3 adjacent to (or near to) the display area DA in this stated order.

A thin layer transistor TFT and the organic light-emitting device 200 electrically connected to the thin layer transistor TFT may be disposed on the display area DA. The thin layer transistor TFT may include a semiconductor layer 120 (including amorphous silicon, polycrystalline silicon, and/or an organic semiconductor material), a gate electrode 140, a source electrode 160s, and a drain electrode 160d. General configurations of the thin layer transistor TFT and the organic light-emitting device 200 will be described in more detail.

A buffer layer 110 formed of silicon oxide, silicon nitride, etc. may be disposed on the substrate 100 in order to flatten a surface of the substrate 100 or prevent (or protect) impurities from permeating into the semiconductor layer 120 of the thin layer transistor TFT. The semiconductor layer 120 may be disposed on the buffer layer 110.

The gate electrode 140 may be disposed on the semiconductor layer 120. The source electrode 160s and the drain electrode 160d may be electrically connected according to a signal applied to the gate electrode 140. Considering adhesiveness with an adjacent layer, surface flatness of a layer to be stacked, and workability, the gate electrode 104 may be formed as a single layer or a multilayer structure including one or more materials selected from, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

In this regard, a gate insulation layer 130 may be disposed between the semiconductor layer 120 and the gate electrode 140 to secure insulation between the semiconductor layer 120 and the gate electrode 140. The gate insulating layer 130 may include an insulating material and may include, for example, an inorganic insulating material (such as silicon oxide and/or silicon nitride), and/or an organic insulating material such as an acryl-based organic substance, BCB, etc.

The organic insulating layer 150 may be disposed on the gate electrode 140. The organic insulating layer 150 may be interposed between the gate electrode 140 and the source electrode 160s and the drain electrode 160d to secure insulation of the gate electrode 140 from the source electrode 160s and the drain electrode 160d. The organic insulating layer 150 may be formed as a single layer or multilayer structure including, for example, the acryl-based organic substance, BCB, etc.

The source electrode 160s and the drain electrode 160d may be disposed on the organic insulating layer 150. The source electrode 160s and the drain electrode 160d may be electrically connected to the semiconductor layer 120 through contact holes formed in the gate insulating layer 130. The source electrode 160s and the drain electrode 160d may be formed as a single layer or a multilayer structure including one or more materials selected from, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) (by considering conductivity, etc.).

Meanwhile, a protection layer may cover the thin layer transistor TFT to protect the thin layer transistor TFT having the above structure. The protection layer may include an inorganic substance such as silicon oxide, silicon nitride, or silicon oxynitride.

Meanwhile, a planarization layer 170 may be disposed on the substrate 100. In this case, the planarization layer 170 may be the protection layer. The planarization layer 170 may flatten an upper surface of the thin layer transistor TFT and protect the thin layer transistor TFT and various components when the organic light-emitting device 200 is disposed on the thin layer transistor TFT. The planarization layer 170 may include, for example, an acryl-based organic substance, BCB, etc. In this regard, as shown in FIG. 2, the buffer layer 110, the gate insulating layer 130, the organic insulating layer 150, and the planarization layer 170 may be formed on the whole surface of the substrate 100.

Meanwhile, a pixel-defining layer 180 may be disposed on the thin layer transistor TFT. The pixel-defining layer 180 may be disposed on the planarization layer 170 and may have an opening. The pixel-defining layer 180 may define a pixel area on the substrate 100.

The pixel-defining layer 108 may include, for example, an organic insulating material. The organic insulating material may include acrylic polymer (such as poly(methyl methacrylate) (PMMA)), polystyrene (PS), a polymer derivative having a phenol group, imide polymer, acryl ester-based polymer, amide-based polymer, fluorine-based polymer, p-xylene polymer, vinyl alcohol polymer, and/or a mixture thereof.

Meanwhile, the organic light-emitting device 200 may be disposed on the pixel-defining layer 180. The organic light-emitting device 200 may include a pixel electrode 210, an intermediate layer 220 including an emission layer (EML), and an opposite electrode 230.

The pixel electrode 210 may be a (semi-)transparent electrode or a reflective electrode. When the pixel electrode 210 is a (semi-)transparent electrode, the pixel electrode 210 may include indium tin oxide (ITO), indium zinc oxide (IZO), zinc oxide (ZnO), indium oxide ($In_2O_3$), indium gallium oxide (IGO), and/or aluminum zinc oxide (AZO). When the pixel electrode 210 is a reflective electrode, the pixel electrode 210 may include a reflective layer having silver (Ag), magnesium (Mg), aluminum (Al), platinum (Pt), palladium (Pd), gold (Au), Nickel (Ni), Neodymium (Nd), Iridium (Ir), chromium (Cr), and a mixture thereof, and a layer including indium tin oxide (ITO), indium zinc oxide (IZO), zinc oxide (ZnO), indium oxide ($In_2O_3$), indium gallium oxide (IGO), and/or aluminum zinc oxide (AZO). The inventive concept is not limited thereto. The pixel electrode 210 may include various materials, and a structure thereof may be modified in various forms including a single layer or a multilayer.

The intermediate layer 220 may be disposed in the pixel area defined by the pixel-defining layer 180. The intermediate layer 220 may include an emission layer EML that emits light according to an electrical signal. In addition to the emission layer EML, the intermediate layer 220 may be formed as a single or complex structure including a hole injection layer (HIL) disposed between the emission layer EML and the pixel electrode 210, a hole transport layer (HTL), and an electron transport layer (ETL) disposed between the emission layer EML and the opposite electrode 230, or an electron injection layer. However, the intermediate layer 220 is not limited thereto, and may have various suitable structures.

The opposite electrode 230 may be disposed on the whole surface of the substrate 100 and cover the intermediate layer 220 including the emission layer EML and face the pixel electrode 210. The opposite electrode 230 may be a (semi-)transparent electrode or a reflective electrode.

When the opposite electrode 230 is a (semi-)transparent electrode, the opposite electrode 230 may include a layer including metal having a small work function (such as lithium (Li), calcium (Ca), lithium fluoride calcium (LiF/Ca), lithium fluoride aluminum (LiF/Al), aluminum (Al), silver (Ag), magnesium (Mg), and/or a mixture thereof), and a (semi-) transparent conductive layer of indium tin oxide (ITO), indium zinc oxide (IZO), zinc oxide (ZnO), and/or indium oxide ($In_2O_3$). When the opposite electrode 230 is a reflective electrode, the opposite electrode 230 may include a layer including lithium (Li), calcium (Ca), lithium fluoride calcium (LiF/Ca), lithium fluoride aluminum (LiF/Al), aluminum (Al), silver (Ag), magnesium (Mg), and/or a mixture thereof. However, the structure and materials of the opposite electrode 230 are not limited thereto, and may be modified in various forms.

Meanwhile, the organic insulating layer 150 of the display apparatus 1 according to the present embodiment may be disposed on the display area DA as described above and extend on a first peripheral area PA1 adjacent to the display area DA. The organic insulating layer 150 may include a first end portion surface 150a in a direction of the pad unit PAD (i.e., in the direction toward the pad unit PAD), as shown in FIG. 2, and end portion surfaces other than the first end portion surface 150a. In the present embodiment, the display area DA of the display apparatus 1 has a rectangular shape, and thus the organic insulating layer 150 may include four end portion surfaces. The first end portion surface 150a may be located in the direction of the pad unit PAD as described above, and the other three end portion surfaces may be formed and located in other directions.

The inorganic insulating layer 152 may be disposed on the same layer as the organic insulating layer 150. The inorganic insulating layer 152 may be disposed on the peripheral area PA. In more detail, the inorganic insulating layer 152 may be disposed on a part of the second and third peripheral areas PA2 and PA3 excluding the first peripheral area PA1 in which the organic insulating layer 150 is disposed.

The inorganic insulating layer 152 and the organic insulating layer 150 may not be spaced apart from each other but may be continuously disposed (e.g., abutting each other), and thus the inorganic insulating layer 152 and the organic insulating layer 150 may contact each other. In more detail, the first end portion surface 150a in the direction of the pad unit PAD of the organic insulating layer 150, i.e. in a direction of the inorganic insulating layer 152, may surface-contact the second end portion surface 152a in a direction of the organic insulating layer 150 (i.e., in the direction toward the organic insulating layer 150). The inorganic insulating layer 152 may extend in the direction of the pad unit PAD in relation opposite to the second end portion surface 152a (i.e., in the direction facing oppositely away from the organic insulating layer 150) and may be provided to extend onto an edge of the substrate 100. The inorganic insulating layer 152 may be disposed on the whole surface of the area in which the pad unit PAD is located.

A connection wiring 142 may be provided on the peripheral area PA and may be disposed below the inorganic insulating layer 152 and a lower portion of the organic insulating layer 150. That is, the connection wiring 142 may be disposed below a location where the first end portion surface 150a of the organic insulating layer 150 and the second end portion surface 152a of the inorganic insulating layer 152 contact each other. The connection wiring 142 may be disposed over the first, second, and third peripheral areas PA1, PA2, and PA3 in FIG. 2 but the inventive concept is not limited thereto. Also, as shown in FIG. 2, the connection wiring 142 may be electrically connected to the pad unit PAD via a through hole formed in the inorganic insulating layer 152.

Meanwhile, the thin film encapsulation layer 300 may be disposed on the display area DA. Also, the thin film encapsulation layer 300 may have a multilayer structure in which one or more organic layers and inorganic layers are alternately stacked.

The thin film encapsulation layer 300 may be formed on the whole surface of the display area DA and cover the organic light-emitting device 200, and may be provided to extend onto the second peripheral area PA2 adjacent to the display area DA. That is, the thin film encapsulation layer 300 may cover the display area DA and the first and second peripheral areas PA1 and PA2 in the periphery of the display area DA. Thus, the thin film encapsulation layer 300 may cover at least a part of the inorganic insulating layer 152, and, in more detail, may cover the inorganic insulating layer 152 located on the second peripheral area PA2.

Figure 3:
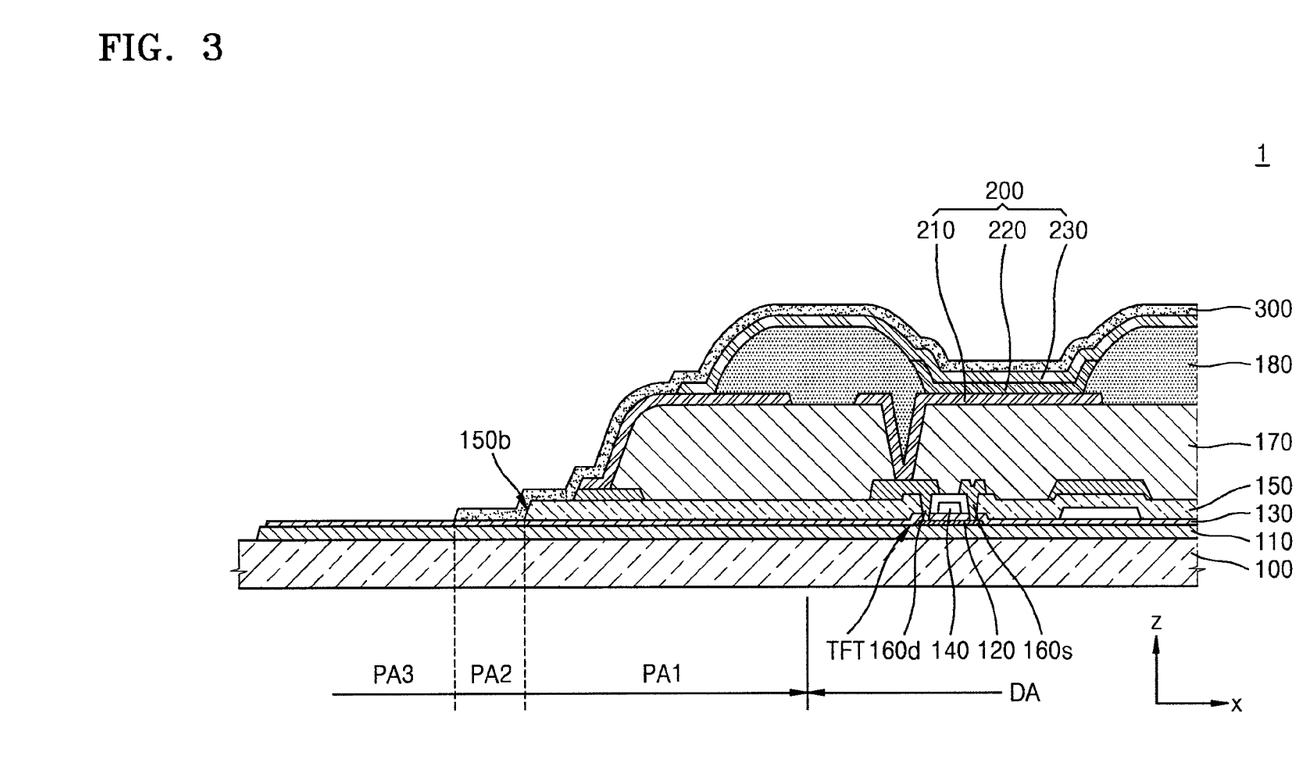
FIG. 3 is a schematic cross-sectional view of the display apparatus of FIG. 1 taken along a line III-III.

FIG. 3 is a schematic cross-sectional view of the display apparatus 1 of FIG. 1 taken along a line III-III. FIG. 3 is a cross-sectional view of a part of the display apparatus 1 excluding a part where the pad unit PAD is located. Thus, differences between FIGS. 2 and 3 will now be described.

Referring to FIG. 3, the thin film transistor TFT and the organic light-emitting device 200 may be disposed on the display area DA of the substrate 100. The organic insulating layer 150 may cover the display area DA and the first peripheral area PA1 adjacent to the display area DA as described above.

Meanwhile, unlike the cross-sectional view of FIG. 2 of the part of the display apparatus 1 where the pad unit APD is located, the inorganic insulating layer 152 is not illustrated in the cross-sectional view of FIG. 3. The inorganic insulating layer 152 may extend to cover the first area between the organic insulating layer 150 and the pad unit PAD and the second area of the peripheral area PA, in which the pad unit PAD is located, and thus the inorganic insulating layer 152 may not be provided in other areas.

That is, the first end portion surface 150a of the organic insulating layer 150 and the second end portion surface 152a of the inorganic insulating layer 152 may surface-contact each other in FIG. 2, whereas an end portion surface 150b excluding the first end portion surface 150a of the organic insulating layer 150 may not contact the inorganic insulating layer 152 in FIG. 3. In this case, the end portion surface 150b of the organic insulating layer 150 may be covered by the thin film encapsulation layer 300 that is formed to cover the display area DA and extend on the second peripheral area PA2 via the first peripheral area PA1. The thin film encapsulation layer 300 may cover the end portion surface 150b of the organic insulating layer 150, extend on the second peripheral area PA2, and surface-contact the gate insulating layer 130. As described above, the end portion surface 150b may be covered by the thin film encapsulation layer 300, other than the first end portion surface 150a of the organic insulating layer 150 in which the inorganic insulating layer 152 is not disposed, thereby blocking oxygen and moisture from the end portion surface 150b of the organic insulating layer 150.

Although a cross-section of the part facing the part where the pad unit PAD is located is illustrated in FIG. 3, a cross-section taken along an X axis may be also the same as shown in FIG. 3.

As described above, the display apparatus 1 according to the present embodiment may include the inorganic insulating layer 152 in the part where the pad unit PAD is located and the organic insulating layer 150 in the remaining part, thereby securing the bendability of the display apparatus 1 and simultaneously or concurrently providing the display apparatus 1 that is strong regarding protection from permeation of moisture.

Figure 4:
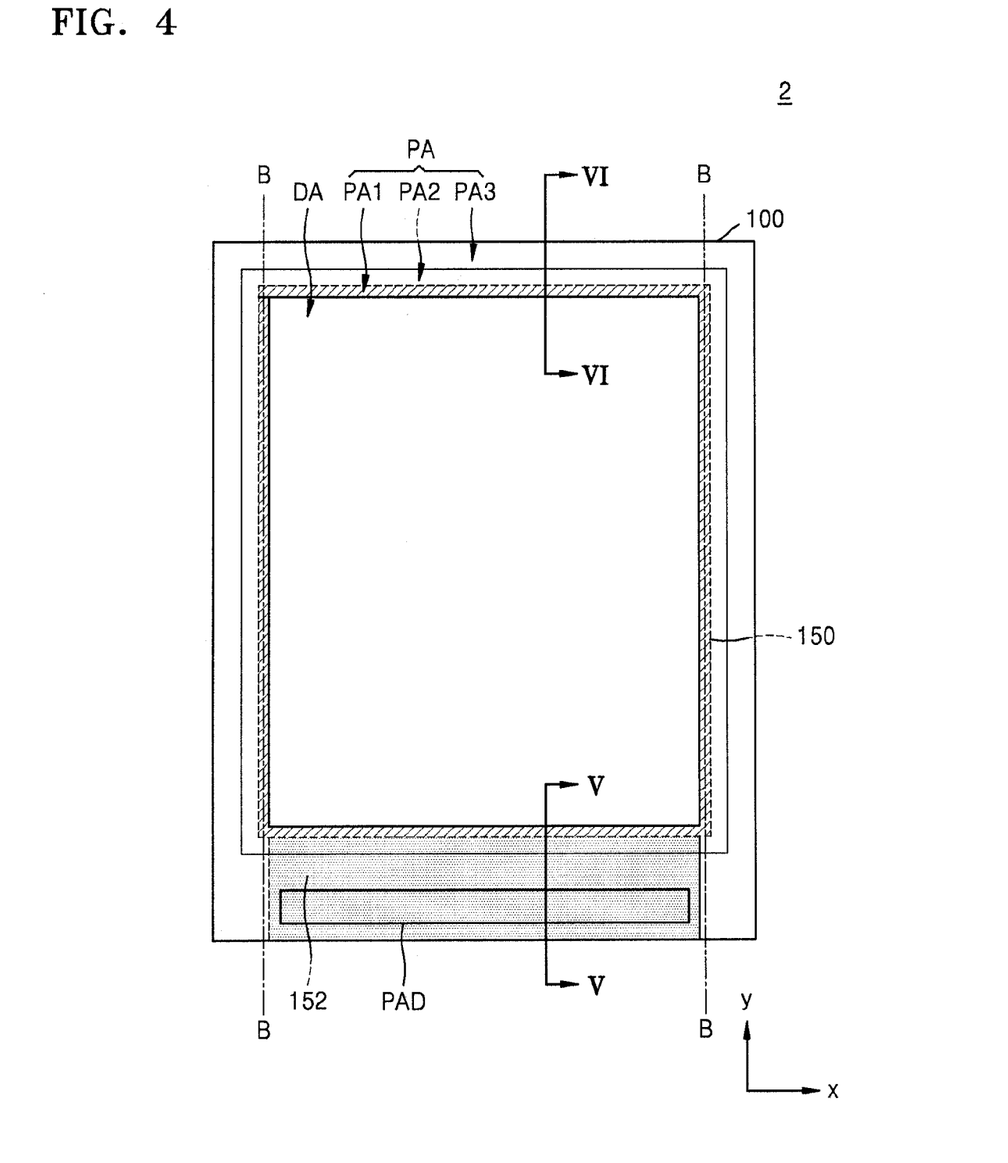
FIG. 4 is a schematic cross-sectional view of a display apparatus according to another exemplary embodiment.

FIG. 4 is a schematic cross-sectional view of a display apparatus 2 according to another exemplary embodiment.

Referring to FIG. 4, the display apparatus 2 according to an exemplary embodiment may include the substrate 100, the pad unit PAD, the organic insulating layer 150, and the inorganic insulating layer 152 that are provided on the substrate 100.

The substrate 100 having flexibility or bendability may include various materials, for example, a metal material or a plastic material such as polyethylene terephthalate (PET), polyethylene naphthalate (PEN), polyimide (PI), etc. However, the materials of the substrate 100 of the display apparatus 2 according to the inventive concept are not necessarily limited thereto and may be variously modified. The substrate 100 may include the display area DA and the peripheral area PA surrounding the display area DA. The peripheral area PA may include the first peripheral area PA1, the second peripheral area PA2, and the third peripheral area PA3 in an order of surrounding and adjacent to (or near to) the display area DA.

A display unit may be disposed in the display area DA of the substrate 100 and may include a plurality of display devices. The plurality of display devices may be, for example, liquid crystal devices or organic light-emitting devices. The display unit may include thin layer transistors that are electrically connected to the plurality of display devices. In the present embodiment, a structure in which the organic light-emitting device is formed as the display device will now be described.

The pad unit PAD may be located in the peripheral area PA of the substrate 100. The pad unit PAD may be located in the peripheral area PA corresponding to one end portion of the display area DA and may include a plurality of pads. That is, the plurality of pads may be disposed in the peripheral area PA corresponding to one end portion of the display area DA in one direction to form the pad unit PAD. The pad unit PAD may be exposed to the outside through an opening formed in the inorganic insulating layer 152 that will be described later. A flexible printed circuit board (FPCB) may be attached onto the pad unit PAD.

The pad unit PAD may be formed in a way that the plurality of pads are exposed to the outside through the opening and the FPCB is physically attached onto the plurality of pads as described above. Thus, there is a problem that an end portion of the display area DA in a direction of the pad unit PAD may be more vulnerable to permeation of moisture than another end portion of the display area DA. In this regard, the display apparatus 1 of the present embodiment provides a solution to this problem.

The organic insulating layer 150 may be disposed on the display area DA of the substrate 100. The organic insulating layer 150 may be included in the display unit and may have a single or multiple layer structure. The organic insulating layer 150 may cover the display DA and a part of the peripheral area PA adjacent to the display area DA. In other words, as shown in FIG. 4, the organic insulating layer 150 may cover the display area DA and the first peripheral area PA1 adjacent to the display area DA of the peripheral area PA. The organic insulating layer 150 may include an organic insulating material and may include, for example, an acryl-based organic substance, BCB, etc.

The inorganic insulating layer 152 may be disposed on the peripheral area PA of the substrate 100. The inorganic insulating layer 152 may be disposed on the same layer as the organic insulating layer 150. The inorganic insulating layer 152 may cover at least a first area when the first area is defined as an area between the organic insulating layer 150 and the pad unit PAD. When a part of the substrate 100, in which the pad unit PAD is located, is defined as a second area, the inorganic insulating layer 152 may extend to cover the second area. That is, the inorganic insulating layer 152 may be disposed in an overall surface of an area, in which the pad unit PAD is located from one end portion of the organic insulating layer 150 in a direction in which the pad unit PAD is located. Thus, the pad unit PAD may be located on the inorganic insulating layer 152.

The display apparatus 2 according to the present embodiment may have first and second bending axes B1-B1 and B2-B2 that are formed in one direction (Y axis direction). The first and second bending axes B1-B1 and B2-B2 may be formed in parallel in one direction (Y axis direction). The first and second bending axes B1-B1 and B2-B2 may be located on (and within) the first peripheral area PA1 in FIG. 4 but the inventive concept is not limited thereto. According to another exemplary embodiment, the peripheral area PA may further expand to an edge of the substrate 100, and the first and second bending axes B1-B1 and B2-B2 may be located on the display area DA.

In this regard, the first and second bending axes B1-B1 and B2-B2 may not be formed across the inorganic insulating layer 152 since the inorganic insulating layer 152 is vulnerable to cracks, which decreases the bendability of the display apparatus 1. That is, when the display apparatus 2 according to the present embodiment is bent along the first and second bending axes B1-B1 and B2-B2, the first and second bending axes B1-B1 and B2-B2 may not be formed across the inorganic insulating layer 152 that is vulnerable to cracks, thereby securing the bendability of the display apparatus 2 and also dramatically reducing damage to the inorganic insulating layer 152 by the cracks.

Therefore, the inorganic insulating layer 152 may be located between the first and second bending axes B1-B1 and B2-B2 as shown in FIG. 4. The pad unit PAD provided on the inorganic insulating layer 152 may also be located between the first and second bending axes B1-B1 and B2-B2 since a size of the inorganic insulating layer 152 may be adjusted according to locations and directions in which the first and second bending axes B1-B1 and B2-B2 are located, and thus an area in which the pad unit PAD is formed may be also adjusted.

Meanwhile, the thin film encapsulation layer 300 may be disposed on the display area DA. The thin film encapsulation layer 300 may be disposed on the organic insulating layer 150 and may be disposed above the organic insulating layer 150 and cover the organic light-emitting device 200. Since the organic light-emitting device 200 is vulnerable to permeation of moisture, the organic light-emitting device 200 may prevent (or protect) oxygen and moisture from entering into the display unit from the outside through the thin film encapsulation layer 300. The thin film encapsulation layer 300 may be formed as a multilayer structure in which organic layers and inorganic layers are alternately stacked.

The thin film encapsulation layer 300 may completely cover the display unit for sealing, and, as shown in FIG. 4, may cover the display area DA and the first peripheral area PA1 and the second peripheral area PA2 adjacent to the display area DA. In this regard, the thin film encapsulation layer 300 may cover at least a part of an inorganic insulating layer located in an area between the organic insulating layer 150 and the pad unit PAD.

As described above, the thin film encapsulation layer 300 may cover the first peripheral area PA1 and the second peripheral area PA2 adjacent to the display area DA, and thus end portion surfaces other than one end portion surface formed by extending the inorganic insulating layer 152 may be covered by the thin film encapsulation layer 300. In other words, an end portion surface of the organic insulating layer 150 may contact the end portion surface of the inorganic insulating layer 152 or may contact the thin film encapsulation layer 300.

Figure 5:
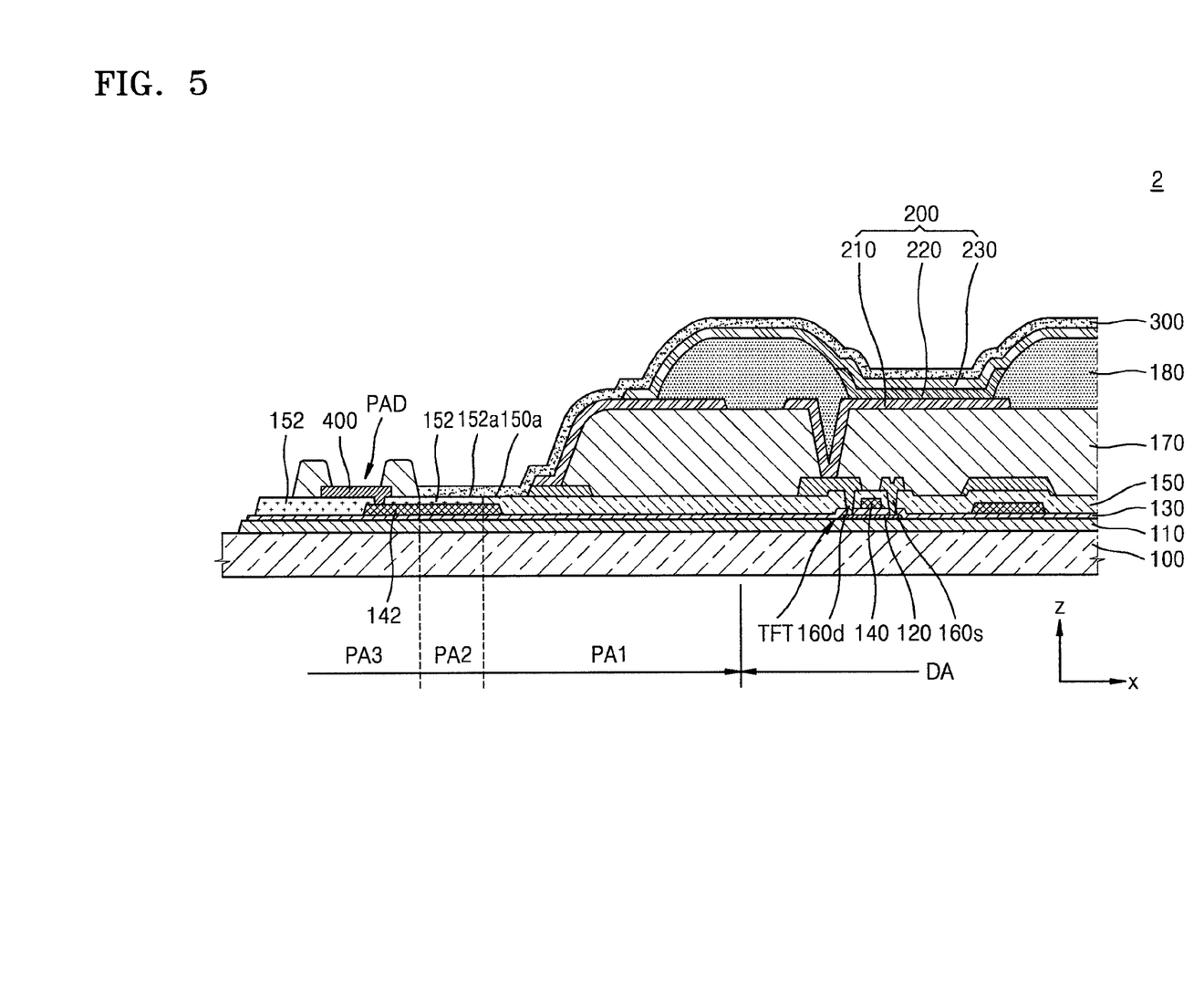
FIG. 5 is a schematic cross-sectional view of the display apparatus of FIG. 4 taken along a line V-V.

FIG. 5 is a schematic cross-sectional view of the display apparatus 2 of FIG. 4 taken along a line V-V.

Referring to FIG. 5, the substrate 100 may include the display area DA and the peripheral area PA surrounding the display area DA. The peripheral area PA may include the first peripheral area PA1, the second peripheral area PA2, and a third peripheral area PA3 adjacent to the display area DA in this stated order.

A thin layer transistor TFT and the organic light-emitting device 200 electrically connected to the thin layer transistor TFT may be disposed on the display area DA. The thin layer transistor TFT may include the semiconductor layer 120 (including amorphous silicon, polycrystalline silicon, and/or an organic semiconductor material), the gate electrode 140, the source electrode 160s, and the drain electrode 160d. General configurations of the thin layer transistor TFT and the organic light-emitting device 200 will be described in more detail.

The buffer layer 110 formed of silicon oxide, silicon nitride, etc. may be disposed on the substrate 100 in order to flatten a surface of the substrate 100 or prevent (or protect) impurities from permeating into the semiconductor layer 120 of the thin layer transistor TFT. The semiconductor layer 120 may be disposed on the buffer layer 110.

The gate electrode 140 may be disposed on the semiconductor layer 120. The source electrode 160s and the drain electrode 160d may be electrically connected according to a signal applied to the gate electrode 140. Considering adhesiveness with an adjacent layer, surface flatness of a layer to be stacked, and workability, the gate electrode 104 may be formed as a single layer or a multilayer structure including one or more materials selected from, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

In this regard, the gate insulation layer 130 may be disposed between the semiconductor layer 120 and the gate electrode 140 to secure insulation between the semiconductor layer 120 and the gate electrode 140. The gate insulating layer 130 may include an insulating material and may include, for example, an inorganic insulating material (such as silicon oxide and/or silicon nitride), and/or an organic insulating material (such as an acryl-based organic substance, BCB, etc.).

The organic insulating layer 150 may be disposed on the gate electrode 140. The organic insulating layer 150 may be interposed between the gate electrode 140 and the source electrode 160s and the drain electrode 160d to secure insulation of the gate electrode 140 from the source electrode 160s and the drain electrode 160d. The organic insulating layer 150 may be formed as a single layer or multilayer structure including, for example, the acryl-based organic substance, BCB, etc.

The source electrode 160s and the drain electrode 160d may be disposed on the organic insulating layer 150. The source electrode 160s and the drain electrode 160d may be electrically connected to the semiconductor layer 120 through contact holes formed in the gate insulating layer 130. The source electrode 160s and the drain electrode 160d may be formed as a single layer or a multilayer structure including one or more materials selected from, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), (by considering conductivity, etc.).

Meanwhile, a protection layer may cover the thin layer transistor TFT to protect the thin layer transistor TFT having the above structure. The protection layer may include an inorganic substance such as silicon oxide, silicon nitride, or silicon oxynitride.

Meanwhile, the planarization layer 170 may be disposed on the substrate 100. In this case, the planarization layer 170 may be the protection layer. The planarization layer 170 may flatten an upper surface of the thin layer transistor TFT and protect the thin layer transistor TFT and various components when the organic light-emitting device 200 is disposed on the thin layer transistor TFT. The planarization layer 170 may include, for example, an acryl-based organic substance, BCB, etc. In this regard, as shown in FIG. 5, the buffer layer 110, the gate insulating layer 130, the organic insulating layer 150, and the planarization layer 170 may be formed on the whole surface of the substrate 100.

Meanwhile, the pixel-defining layer 180 may be disposed on the thin layer transistor TFT. The pixel-defining layer 180 may be disposed on the planarization layer 170 and may have an opening. The pixel-defining layer 180 may define a pixel area on the substrate 100.

The pixel-defining layer 108 may include, for example, an organic insulating material. The organic insulating material may include acrylic polymer (such as poly(methyl methacrylate) (PMMA)), polystyrene (PS), a polymer derivative having a phenol group, imide polymer, acryl ester-based polymer, amide-based polymer, fluorine-based polymer, p-xylene polymer, vinyl alcohol polymer, and/or a mixture thereof.

Meanwhile, the organic light-emitting device 200 may be disposed on the pixel-defining layer 180. The organic light-emitting device 200 may include the pixel electrode 210, the intermediate layer 220 including the emission layer (EML), and the opposite electrode 230.

The pixel electrode 210 may be a (semi-)transparent electrode or a reflective electrode. When the pixel electrode 210 is a (semi-)transparent electrode, the pixel electrode 210 may include indium tin oxide (ITO), indium zinc oxide (IZO), zinc oxide (ZnO), indium oxide ($In_2O_3$), indium gallium oxide (IGO), and/or aluminum zinc oxide (AZO). When the pixel electrode 210 is a reflective electrode, the pixel electrode 210 may include a reflective layer having silver (Ag), magnesium (Mg), aluminum (Al), platinum (Pt), palladium (Pd), gold (Au), Nickel (Ni), Neodymium (Nd), Iridium (Ir), chromium (Cr), and a mixture thereof, and a layer including indium tin oxide (ITO), indium zinc oxide (IZO), zinc oxide (ZnO), indium oxide ($In_2O_3$), indium gallium oxide (IGO), and/or aluminum zinc oxide (AZO). The inventive concept is not limited thereto. The pixel electrode 210 may include various materials, and a structure thereof may be modified in various forms including a single layer or a multilayer.

The intermediate layer 220 may be disposed in the pixel area defined by the pixel-defining layer 180. The intermediate layer 220 may include the emission layer EML that emits light according to an electrical signal. In addition to the emission layer EML, the intermediate layer 220 may be formed as a single or complex structure including a hole injection layer (HIL) disposed between the emission layer EML and the pixel electrode 210, a hole transport layer (HTL), and an electron transport layer (ETL) disposed between the emission layer EML and the opposite electrode 230, or an electron injection layer. However, the intermediate layer 220 is not limited thereto, and may have various suitable structures.

The opposite electrode 230 may be disposed on the whole surface of the substrate 100 to cover the intermediate layer 220 including the emission layer EML and to face the pixel electrode 210. The opposite electrode 230 may be a (semi-)transparent electrode or a reflective electrode.

When the opposite electrode 230 is a (semi-)transparent electrode, the opposite electrode 230 may include a layer including metal having a small work function (such as lithium (Li), calcium (Ca), lithium fluoride calcium (LiF/Ca), lithium fluoride aluminum (LiF/Al), aluminum (Al), silver (Ag), magnesium (Mg), and/or a mixture thereof), and a (semi-) transparent conductive layer of indium tin oxide (ITO), indium zinc oxide (IZO), zinc oxide (ZnO), or indium oxide ($In_2O_3$). When the opposite electrode 230 is a reflective electrode, the opposite electrode 230 may include a layer including lithium (Li), calcium (Ca), lithium fluoride calcium (LiF/Ca), lithium fluoride aluminum (LiF/Al), aluminum (Al), silver (Ag), magnesium (Mg), and/or a mixture thereof. However, the structure and materials of the opposite electrode 230 are not limited thereto, and may be modified in various forms.

Meanwhile, the organic insulating layer 150 of the display apparatus 2 according to the present embodiment may be disposed on the display area DA as described above and extend on the first peripheral area PA1 adjacent to the display area DA. The organic insulating layer 150 may include the first end portion surface 150a in a direction of the pad unit PAD (i.e., in the direction toward the pad unit PAD), as shown in FIG. 5 and end portion surfaces other than the first end portion surface 150a. In the present embodiment, the display area DA of the display apparatus 21 has a rectangular shape, and thus the organic insulating layer 150 may include four end portion surfaces. The first end portion surface 150a may be located in the direction of the pad unit PAD as described above, and the other three end portion surfaces may be formed and located in other directions.

The inorganic insulating layer 152 may be disposed on the same layer as the organic insulating layer 150. The inorganic insulating layer 152 may be disposed on the peripheral area PA. In more detail, the inorganic insulating layer 152 may be disposed on a part of the second and third peripheral areas PA2 and PA3 excluding the first peripheral area PA1 in which the organic insulating layer 150 is disposed.

The inorganic insulating layer 152 and the organic insulating layer 150 may not be spaced apart from each other but may be continuously disposed (e.g., abutting each other), and thus the inorganic insulating layer 152 and the organic insulating layer 150 may contact each other. In more detail, the first end portion surface 150a in the direction of the pad unit PAD of the organic insulating layer 150, i.e. in a direction of the inorganic insulating layer 152, may surface-contact the second end portion surface 152a in a direction of the organic insulating layer 150 (i.e., in the direction toward the organic insulating layer 150). The inorganic insulating layer 152 may extend in the direction of the pad unit PAD in relation opposite to the second end portion surface 152a (i.e., in the direction facing oppositely away from the organic insulating layer 150) and may be provided to extend onto an edge of the substrate 100. The inorganic insulating layer 152 may be disposed on the whole surface of the area in which the pad unit PAD is located.

The connection wiring 142 may be provided on the peripheral area PA and may be disposed below the inorganic insulating layer 152 and a lower portion of the organic insulating layer 150. That is, the connection wiring 142 may be disposed below a location where the first end portion surface 150a of the organic insulating layer 150 and the second end portion surface 152a of the inorganic insulating layer 152 contact each other. The connection wiring 142 may be disposed over the first, second, and third peripheral areas PA1, PA2, and PA3 in FIG. 5 but the inventive concept is not limited thereto. Also, as shown in FIG. 5, the connection wiring 142 may be electrically connected to the pad unit PAD via a through hole formed in the inorganic insulating layer 152.

Meanwhile, the thin film encapsulation layer 300 may be disposed on the display area DA. Also, the thin film encapsulation layer 300 may have a multilayer structure in which one or more organic layers and inorganic layers are alternately stacked.

The thin film encapsulation layer 300 may be formed on the whole surface of the display area DA to cover the organic light-emitting device 200, and may be provided to extend onto the second peripheral area PA2 adjacent to the display area DA. That is, the thin film encapsulation layer 300 may cover the display area DA and the first and second peripheral areas PA1 and PA2 in the periphery of the display area DA. Thus, the thin film encapsulation layer 300 may cover at least a part of the inorganic insulating layer 152, and, in more detail, may cover the inorganic insulating layer 152 located on the second peripheral area PA2.

Figure 6:
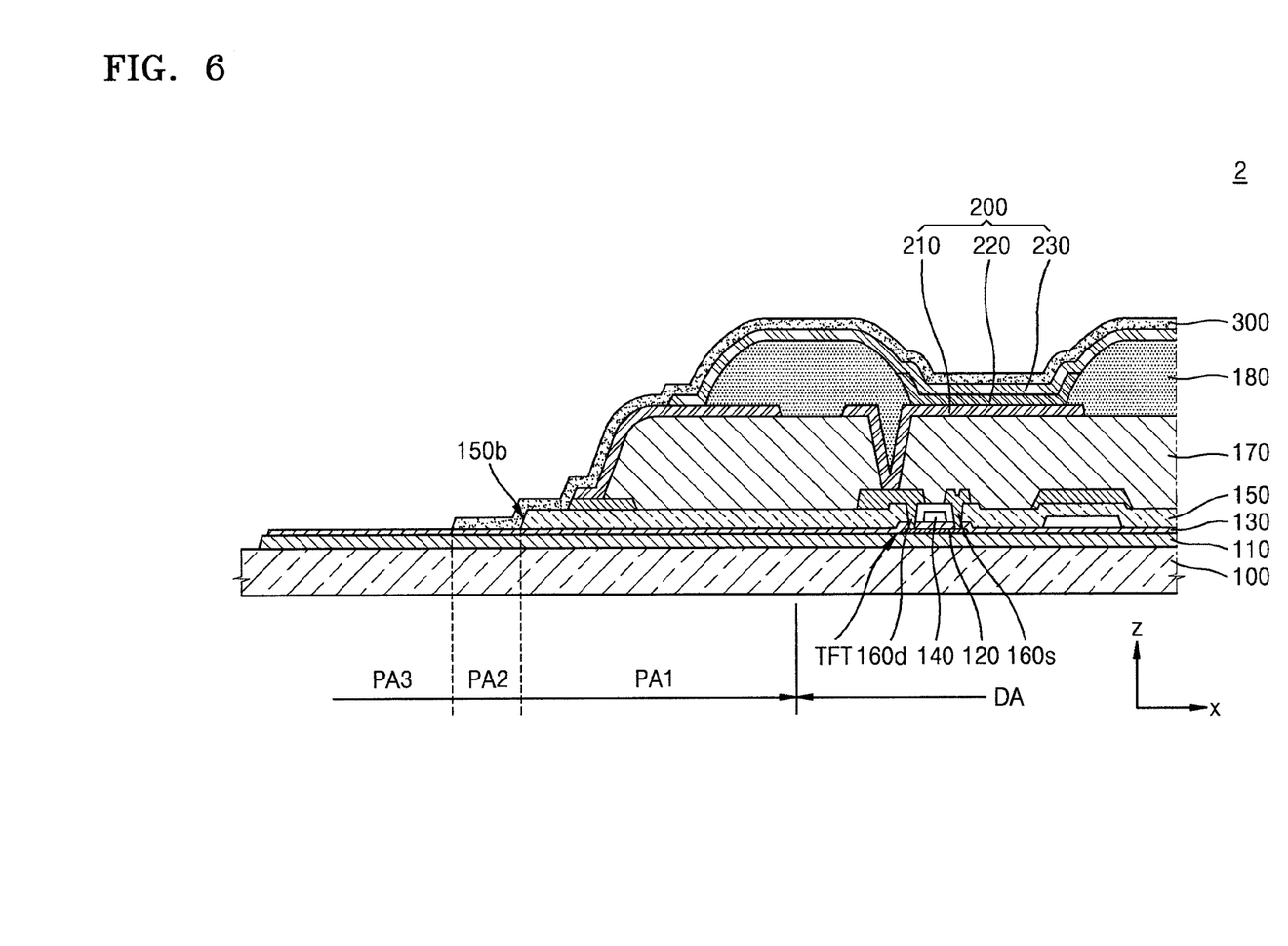
FIG. 6 is a schematic cross-sectional view of the display apparatus of FIG. 4 taken along a line VI-VI.

FIG. 6 is a schematic cross-sectional view of the display apparatus 2 of FIG. 4 taken along a line VI-VI. FIG. 6 is a cross-sectional view of a part of the display apparatus 2 excluding a part where the pad unit PAD is located. Thus, differences between FIGS. 5 and 6 will now be described.

Referring to FIG. 6, the thin film transistor TFT and the organic light-emitting device 200 may be disposed on the display area DA of the substrate 100. The organic insulating layer 150 may cover the display area DA and the first peripheral area PA1 adjacent to the display area DA as described above.

Meanwhile, unlike the cross-sectional view of FIG. 5 of the part of the display apparatus 1 where the pad unit APD is located, the inorganic insulating layer 152 is not illustrated in the cross-sectional view of FIG. 6. The inorganic insulating layer 152 may extend to cover a first area between the organic insulating layer 150 and the pad unit PAD and a second area of the peripheral area PA, in which the pad unit PAD is located, and thus the inorganic insulating layer 152 may not be provided in other areas.

That is, the first end portion surface 150a of the organic insulating layer 150 and the second end portion surface 152a of the inorganic insulating layer 152 may surface-contact each other in FIG. 5, whereas the end portion surface 150b excluding the first end portion surface 150a of the organic insulating layer 150 may not contact the inorganic insulating layer 152 in FIG. 6. In this case, the end portion surface 150b of the organic insulating layer 150 may be covered by the thin film encapsulation layer 300 that is formed to cover the display area DA and extend on the second peripheral area PA2 via the first peripheral area PA1. The thin film encapsulation layer 300 may cover the end portion surface 150b of the organic insulating layer 150, extend on the second peripheral area PA2, and surface-contact the gate insulating layer 130. As described above, the end portion surface 150b may be covered by the thin film encapsulation layer 300, other than the first end portion surface 150a of the organic insulating layer 150 in which the inorganic insulating layer 152 is not disposed, thereby blocking oxygen and moisture from the end portion surface 150b of the organic insulating layer 150.

Although a cross-section of the part facing the part where the pad unit PAD is located is illustrated in FIG. 6, a cross-section taken along an X axis may be also the same as shown in FIG. 6.

As described above, the display apparatus 2 according to the present embodiment may include the inorganic insulating layer 152 in the part where the pad unit PAD is located and the organic insulating layer 150 in the remaining part, thereby securing the bendability of the display apparatus 2 and simultaneously or concurrently providing the display apparatus 1 that is strong regarding protection from permeation of moisture.

As described above, according to the one or more exemplary embodiments, a display apparatus having an improved effect of preventing permeation of moisture may be implemented. However, the scope of the inventive concept is not limited by the effect.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

Expressions such as "at least one of", "one or more of", "at least one selected from", or "one or more selected from" when preceding a list of elements, modify the entire list of elements and do not modify the individual elements of the list. Further, the use of "may" when describing embodiments of the present invention refers to "one or more embodiments of the present invention."

As used herein, the term "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

As used herein, the terms "use," "using," and "used" may be considered synonymous with the terms "utilize," "utilizing," and "utilized," respectively.

The display apparatus and/or any other relevant devices or components according to embodiments of the present invention described herein may be implemented utilizing any suitable hardware, firmware (e.g. an application-specific integrated circuit), software, or a combination of software, firmware, and hardware. For example, the various components of the display apparatus may be formed on one integrated circuit (IC) chip or on separate IC chips. Further, the various components of the display apparatus may be implemented on a flexible printed circuit film, a tape carrier package (TCP), a printed circuit board (PCB), or formed on one substrate. Further, the various components of the display apparatus may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While one or more exemplary embodiments have been described with reference to the figures, it will be understood by those of ordinary skill in the art that various changes in form and details may be made therein without departing from the spirit and scope as defined by the following claims, and equivalents thereof.

What is claimed is:

1. A display apparatus comprising:
a substrate comprising a display area and a peripheral area surrounding the display area;
a pad unit on the peripheral area;
an organic insulating layer covering the display area and a part of the peripheral area adjacent to the display area; and
an inorganic insulating layer covering at least a first area when the first area is a part between the organic insulating layer and the pad unit.

2. The display apparatus of claim 1, wherein the organic insulating layer and the inorganic insulating layer are located on a same layer.

3. The display apparatus of claim 1, wherein the organic insulating layer and the inorganic insulating layer contact each other.

4. The display apparatus of claim 3, wherein a first end portion surface of the organic insulating layer in a direction of the inorganic insulating layer surface-contacts a second end portion surface of the inorganic insulating layer in a direction of the organic insulating layer.

5. The display apparatus of claim 4, further comprising: a thin film encapsulation layer on the organic insulating layer and extending onto the outside of the organic insulating layer.

6. The display apparatus of claim 5, wherein end portion surfaces other than the first end portion surface of the organic insulating layer are covered by the thin film encapsulation layer.

7. The display apparatus of claim 5, wherein end portion surfaces of the organic insulating layer contact the second end portion surface or the thin film encapsulation layer.

8. The display apparatus of claim 5, wherein the thin film encapsulation layer covers at least a part of the inorganic insulating layer.

9. The display apparatus of claim 1, wherein the inorganic insulating layer extends to cover a second area when the second area is a part of the substrate in which the pad unit is located.

10. The display apparatus of claim 9, wherein the pad unit is located on the inorganic insulating layer.

11. The display apparatus of claim 1, further comprising: a connection wiring on the peripheral area such that the connection wiring is located below the inorganic insulating layer and below the organic insulating layer,
wherein the pad unit is electrically connected to the connection wiring via a through hole formed in the inorganic insulating layer.

12. The display apparatus of claim 1, wherein the substrate has a bending axis extending in a direction,
wherein the bending axis does not extend across the inorganic insulating layer.

13. The display apparatus of claim 12, wherein the bending axis comprises a first bending axis and a second bending axis in parallel to the first bending axis,
wherein the inorganic insulating layer is located between the first bending axis and the second bending axis.

14. The display apparatus of claim 13, wherein the pad unit is on the inorganic insulating layer.

15. A method of forming a display apparatus, the method comprising:
providing a substrate to have a display area and a peripheral area surrounding the display area;
providing a pad unit on the peripheral area;
covering an organic insulating layer onto the display area and a part of the peripheral area adjacent to the display area; and
covering an inorganic insulating layer onto at least a first area when the first area is a part between the organic insulating layer and the pad unit.

16. The method of claim 15, wherein the organic insulating layer and the inorganic insulating layer are located on a same layer.

17. The method of claim 15, further comprising providing a bending axis to extend across the substrate in a direction that does not extend across the inorganic insulating layer.

18. The method of claim 17, wherein the bending axis is provided to have a first bending axis and a second bending axis in parallel to the first bending axis,
wherein the inorganic insulating layer is located between the first bending axis and the second bending axis.

* * * * *